(12) United States Patent
Martini et al.

(10) Patent No.: US 6,703,873 B2
(45) Date of Patent: Mar. 9, 2004

(54) PULL-UP CIRCUIT FOR INPUT/OUTPUT TERMINALS OF ELECTRONIC APPLIANCES

(75) Inventors: Marco Martini, Acireale (IT); Salvatore Privitera, Catania (IT)

(73) Assignee: STMicroelectronics S.r.l., Agrata Brianza (IT)

( * ) Notice: Subject to any disclaimer, the term of this patent is extended or adjusted under 35 U.S.C. 154(b) by 0 days.

(21) Appl. No.: 10/263,337

(22) Filed: Oct. 1, 2002

(65) Prior Publication Data

US 2003/0080788 A1 May 1, 2003

(30) Foreign Application Priority Data

Oct. 2, 2001 (IT) ...................... MI2001A2041

(51) Int. Cl.[7] ................................. H03B 1/00
(52) U.S. Cl. ...................... 327/108; 327/112
(58) Field of Search ................ 327/108, 112, 327/427, 434; 326/81, 82, 83, 85, 87

(56) References Cited

U.S. PATENT DOCUMENTS

| | | | | |
|---|---|---|---|---|
| 6,060,906 A | * | 5/2000 | Chow et al. | 326/81 |
| 6,188,243 B1 | * | 2/2001 | Liu et al. | 326/81 |
| 6,362,665 B1 | * | 3/2002 | Davis et al. | 327/108 |
| 6,445,223 B1 | * | 9/2002 | Thilenius | 327/108 |
| 6,573,765 B2 | * | 6/2003 | Bales et al. | 327/108 |

* cited by examiner

*Primary Examiner*—My-Trang Nuton
(74) *Attorney, Agent, or Firm*—Lisa K. Jorgenson; Robert Iannucci; Seed IP Law Group PLLC

(57) ABSTRACT

A pull-up circuit for input/output terminals of electronic appliances is disclosed. The circuit is arranged between an input/output terminal and a supply voltage terminal and includes a first transistor and a resistance serially connected and coupled between the input/output terminal and the supply-voltage terminal and circuitry suitable for driving the transistor so as to switch it on or off depending on whether the values achieved by the voltage of the input/output terminal belong or do not belong to a set range of voltage values within the supply-voltage value.

22 Claims, 3 Drawing Sheets

PULL-UP CIRCUIT FOR INPUT/OUTPUT TERMINALS OF ELECTRONIC APPLIANCES

BACKGROUND OF THE INVENTION

1. Field of the Invention

The present invention refers to a pull-up circuit for input/output terminals of electronic appliances.

2. Description of the Related Art

In the prior art, pull-up resistances are used in connections between digital appliances, for example between computers and printers. In fact in communications between computers and printers the lines that carry the data are terminated by pull-up resistances with a set value. Said resistances are arranged between each data line and the power supply and each data line is connected to a pin or terminal of an interface, i.e., a data input/output (I/O) pin.

If we consider any pull-up resistance Rp arranged between an I/O pin and a terminal of the cable on which a supply voltage Vcc is present, as shown in FIG. 1, it is possible that when the voltage on the I/O pin is higher than the supply voltage Vcc or vice versa there is an undesired flow of current between the I/O pin and the power line. Said current flow consumes energy, which consumption must be as low as possible in many applications such as portable appliances of small dimensions.

BRIEF SUMMARY OF THE INVENTION

An embodiment of the present invention is a pull-up circuit for input/output terminals of electronic appliances that enables the disadvantage described above to be lessened.

The pull-up circuit is arranged between an input/output terminal and a supply-voltage terminal, and includes a first transistor and a resistance connected serially and coupled between said input/output terminal and said supply-voltage terminal, circuitry suitable for driving said transistor so as to switch it on or off depending on whether the values of the voltage of the input/output terminal belong or do not belong to a set range of voltage values within the supply-voltage value. As a result, pull-up circuit minimizes the absorption of current on the input/output terminals and on the supply-voltage terminals.

BRIEF DESCRIPTION OF THE SEVERAL VIEWS OF THE DRAWING(S)

The characteristics and advantages of the present invention will appear evident from the following detailed description of its embodiments thereof, illustrated as non-limiting examples in the enclosed drawings, in which.

DETAILED DESCRIPTION OF THE INVENTION

Figure 2:
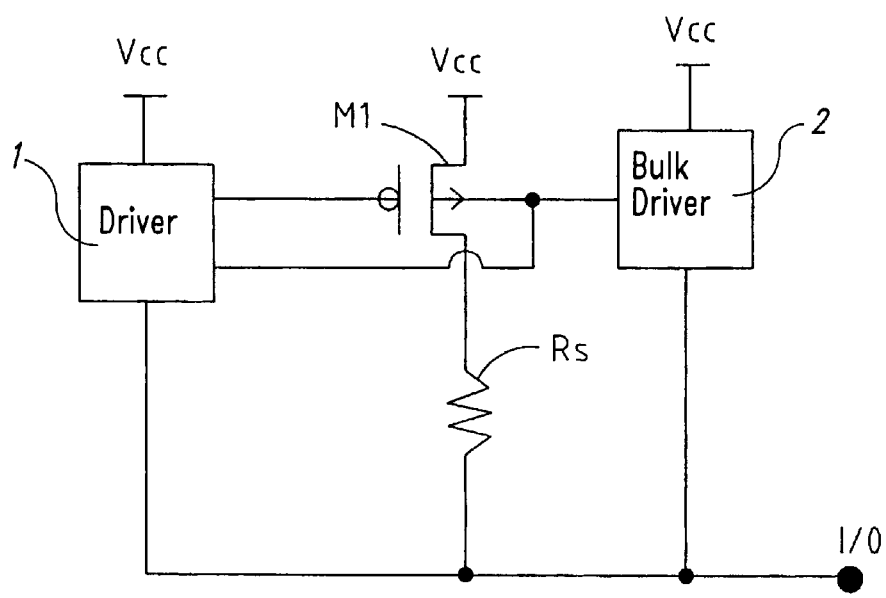
FIG. 2 is a diagrammatic view of the circuit according to an embodiment of the present invention.

With reference to FIG. 2 a pull-up circuit according to the present invention is diagrammatically shown. The circuit comprises a p-channel MOS transistor M1 serially connected to a resistance Rs between the supply Vcc and input/output terminals I/O, preferably an input/output terminal for digital data of an electronic appliance not shown in the Figure. More precisely, the source terminal of the transistor M1 is connected to the supply-voltage terminal Vcc, the drain terminal is connected to a terminal of the resistance Rs, the other terminal of which is connected to the terminal I/O. The dimensions of the transistor M1 should be such that the sum of its switch-on resistance Ron and of the resistance Rs falls within the specifications required for the value of the pull-up resistance.

The gate of the MOS transistor M1 is driven by circuitry comprising a driving device 1 coupled to the terminals Vcc and I/O; device 1 commands the switch-on or the switch-off of the transistor M1, depending on the values assumed by the voltage VI/O on the input/output terminal I/O and on the power supply Vcc.

The circuitry also comprises another device 2 coupled to the terminals Vcc and I/O that supplies the bulk of the MOS transistor M1 and is coupled to the device 1; the device 2 enables the bulks of the MOS transistors of the circuit to be biased to the highest potential between a voltage value slightly below Vcc and a voltage value slightly below or the same as the voltage on the terminal I/O.

Figure 3:
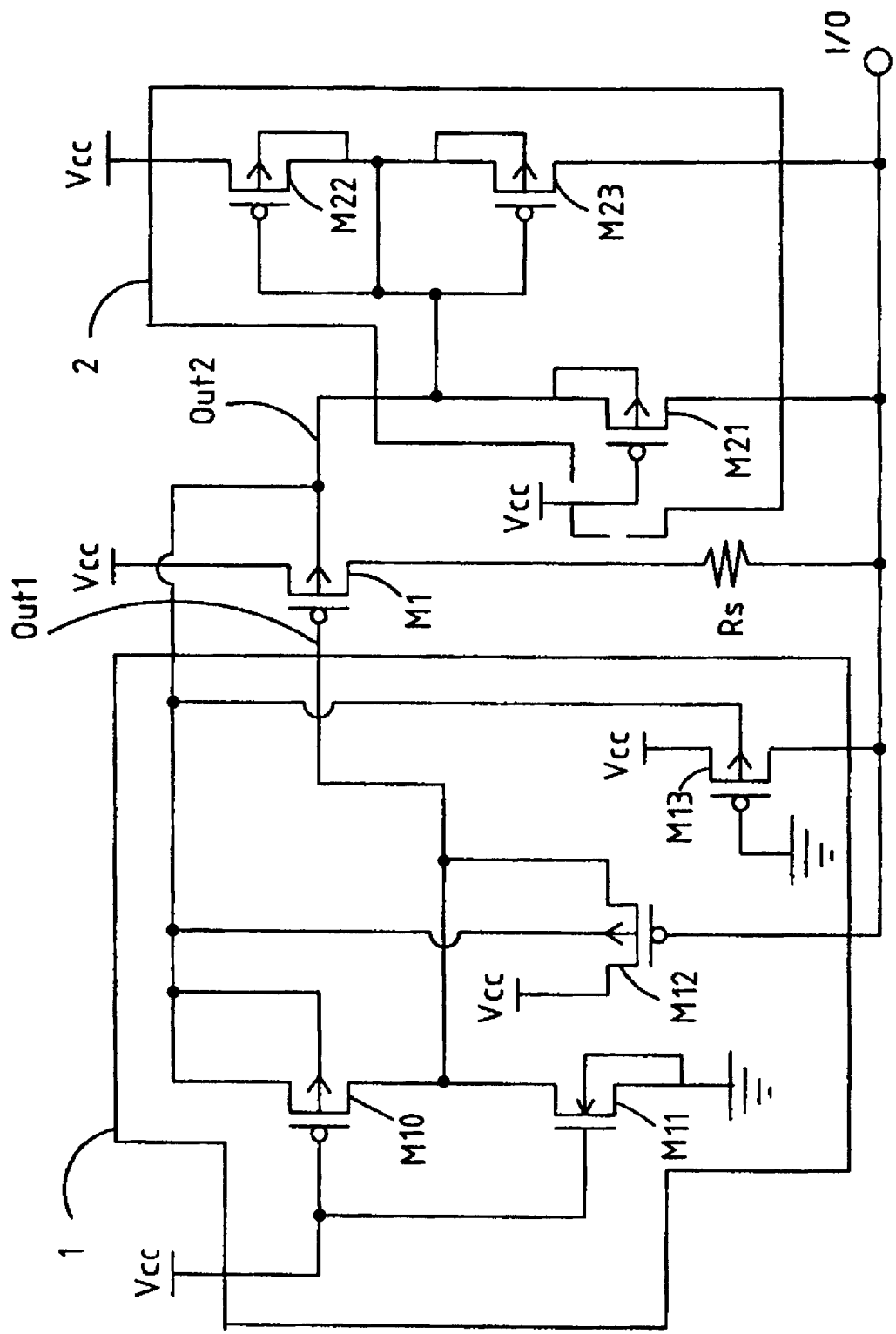
FIG. 3 is a more detailed diagrammatic view of the circuit in FIG. 2.

FIG. 3 describes in greater detail the circuit of FIG. 2. Device 1 comprises a first p-channel MOS transistor M10 and a second n-channel MOS transistor M11, with drain terminals connected together, the gate terminals being connected to the supply-voltage terminal Vcc whilst the source terminal of the transistor M11 is grounded and the source terminal of the transistor M10 is connected to its bulk terminal. The device 1 also comprises third and fourth p-channel MOS transistors, M12 and M13, the source terminals of both of which are connected to the supply-voltage terminal Vcc; the transistor M12 has its gate terminal coupled to the input/output terminal I/O and has its drain terminal connected to the drain terminals of the transistors M10 and M11 and to an output terminal Out1 of the device 1 that is connected to the gate terminal of the transistor M1; the transistor M13's gate terminal is grounded and its drain terminal is connected to the terminal I/O. The transistors M10–M13 have their bulk terminals coupled to an output terminal Out2 of the device 2.

The transistor M13 is always switched-on and its switch-on resistance is much greater than the sum of the resistances Rs and of the switch-on resistance Ron1 of the transistor M1.

When the voltage on the input/output terminal I/O is high (forced by the electronic appliance to which the terminal I/O is connected) so as to keep the transistor M12 switched off, the voltage on the gate terminal of the transistor M1 is at a low value because the transistor M11 is switched on; in this way the transistor M1 is switched on and for this reason there is a current between the supply Vcc and terminals I/O via the resistances Rs and Ron1.

When the voltage on the input/output terminal I/O is low (forced by the electronic appliance to which the terminal I/O is connected) so as to switch on the transistor M12, the voltage on the drain terminal of the transistor M12 and therefore on the gate terminal of the transistor M1 increases and thereby causes the transistor M1 to switch off and prevents the flow of current from the terminal Vcc towards the terminal I/O. This occurs for as long as the voltage on the terminal I/O is lower than the difference between the supply voltage Vcc and the voltage V12 provided by the threshold voltage Vth12 and a voltage Vx1 that indicates the amount by which the source-gate voltage Vgs of the transistor M12 must exceed the threshold voltage Vth12 in order to switch off the transistor M1

$$VI/O<Vcc-(Vth12+Vx1).$$

The voltage Vx1 needs to be added to the threshold voltage Vth12 to offset the effect of the transistor M11 on the drain terminal of the transistor M12; the transistor M11 is always switched on unless the voltage Vcc is zero or near to zero and the value of the voltage Vx1 depends on the dimensions of transistors M11 and M12.

The transistor M13 ensures that when the terminal I/O is disconnected from the electrical appliance to which it is connected and the voltage on the terminal I/O is at a low or high value, the value of the voltage on the terminal I/O reaches the supply voltage Vcc so as to enable the switch-off of the transistor M12 and consequently enable the transistor M1 to be switched on.

The device 2 enables biasing of the bulk terminals of the p-channel MOS transistors M1, M10, M12, M13 to the highest potential between a voltage value slightly less than the supply voltage Vcc and a voltage value slightly less or the same as the voltage on the terminal I/O. Said device comprises a p-channel MOS transistor M21 with a gate terminal connected to the supply voltage Vcc, the drain terminal being connected to the drain terminal I/O and the source and bulk terminals being connected to the output terminal Out2 of the device 2. The device 2 also comprises two p-channel MOS transistors M22 and M23, both being connected as a diode and sharing a gate terminal and being connected to output terminal Out2, whereas the source terminal of the transistor M22 is connected to the supply-voltage terminal Vcc and the source terminal of the transistor M23 is connected to the terminal I/O. If the supply voltage Vcc is higher than the voltage on the terminal I/O the voltage on the gate terminals of the transistors M22 and M23 and therefore on the terminal Out2 will be the same as Vcc−Vth22 wherein Vth22 is the threshold voltage of the transistor M22. If the voltage VI/O is higher than the supply voltage Vcc, considering the threshold voltages of the transistors M23 and M21, the voltage on the terminal Out2 will vary from the value VI/O−Vth23 (where Vth23 is the threshold voltage of the transistor M23) to a value that is the same as the voltage on the terminal I/O due to switch-on of the transistor M21.

If the voltage on the terminal I/O is high and voltage Vcc=0, the transistor M12 is switched off, the transistor M10 is switched on and the transistor M1 is switched off. In this case, as the voltage of the bulk of the MOS transistors is the same as the voltage on the terminal I/O, a current will run through the transistor M21 and the transistors M10 and M11.

VI/O>Vcc+Vth10+Vx2 may occur, where the voltage Vx2 is the voltage to be added to the voltage Vth10, the threshold voltage of the transistor M10, to switch off the transistor M1; the voltage Vx2 depends on the dimensions of the transistors M10 and M11. In this case, as in the previous case, the transistor M12 is switched off, the transistor M10 is switched on and the transistor M1 is switched off; as the voltage of the bulk of the MOS transistors is the same as the voltage on the terminal I/O, a current will flow through the transistor M21 and the transistors M10 and M11.

The circuit in FIG. 3 therefore acts as a pull-up resistance when the voltage on the terminal I/O is high with voltage values in the range between Vcc−(Vth12+Vx1) and Vcc+Vth10+Vx2. For all the voltage values not included in said range the current absorbed by the terminal I/O is zero or very low. For example, said range of voltage values (Vcc−Vth12−Vx1, Vcc+Vth10+Vx2) comprises voltage values that are no more than two volts above or below the value of the supply voltage Vcc; in fact, for example, the possible voltage values of Vx1, Vx2, Vth10 and Vth12 are Vth10=Vth12=0.9V, Vx1=0.4V and Vx2=0.5V.

Figure 1:
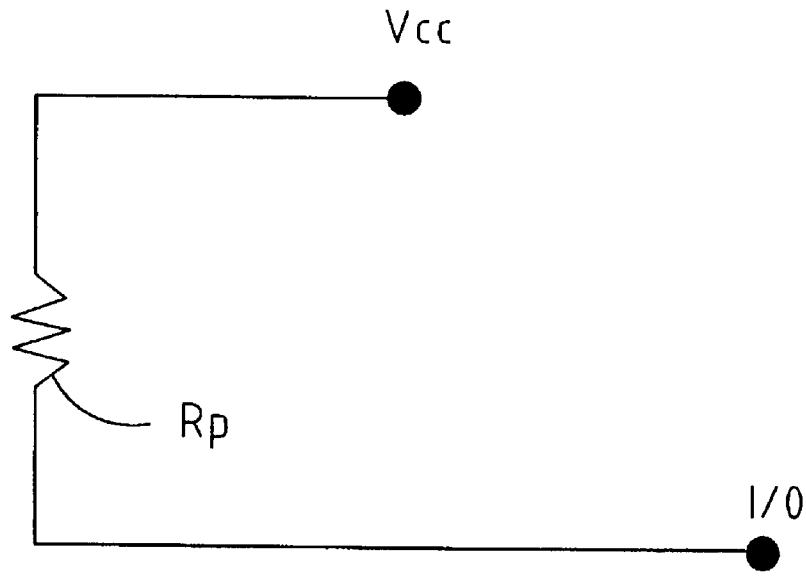
FIG. 1 is a diagrammatic view of a pull-up resistance used in a circuit according to the prior art.
Figure 4:
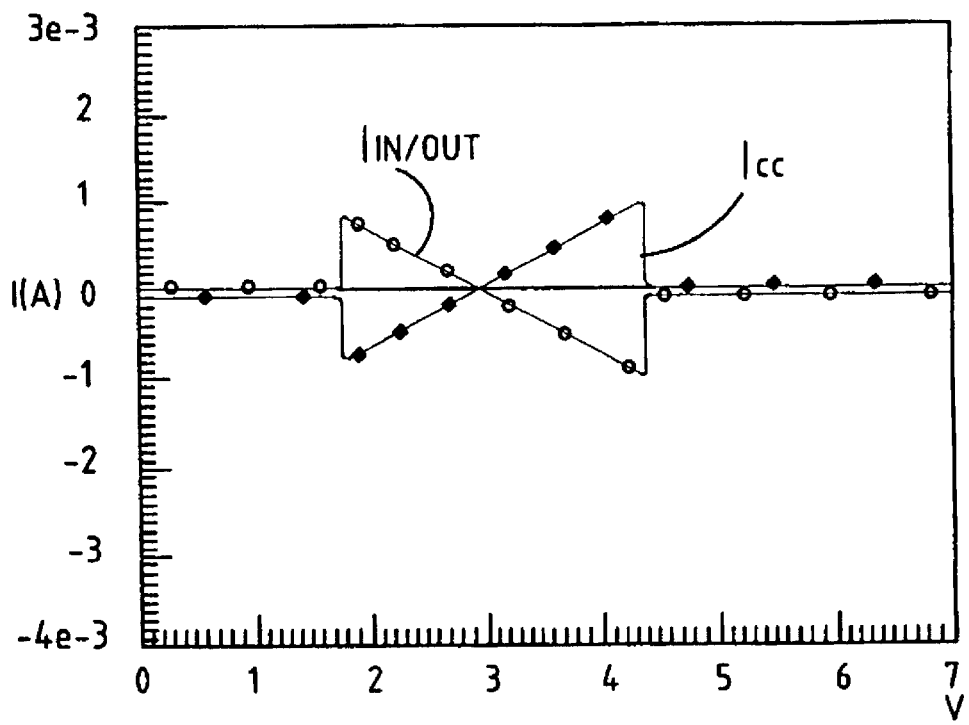
FIG. 4 is a diagram of the variation in currents on the terminal I/O on the supply-voltage terminal depending on the voltage VI/O on the terminal I/O using the circuit shown in FIG. 3.
Figure 5:
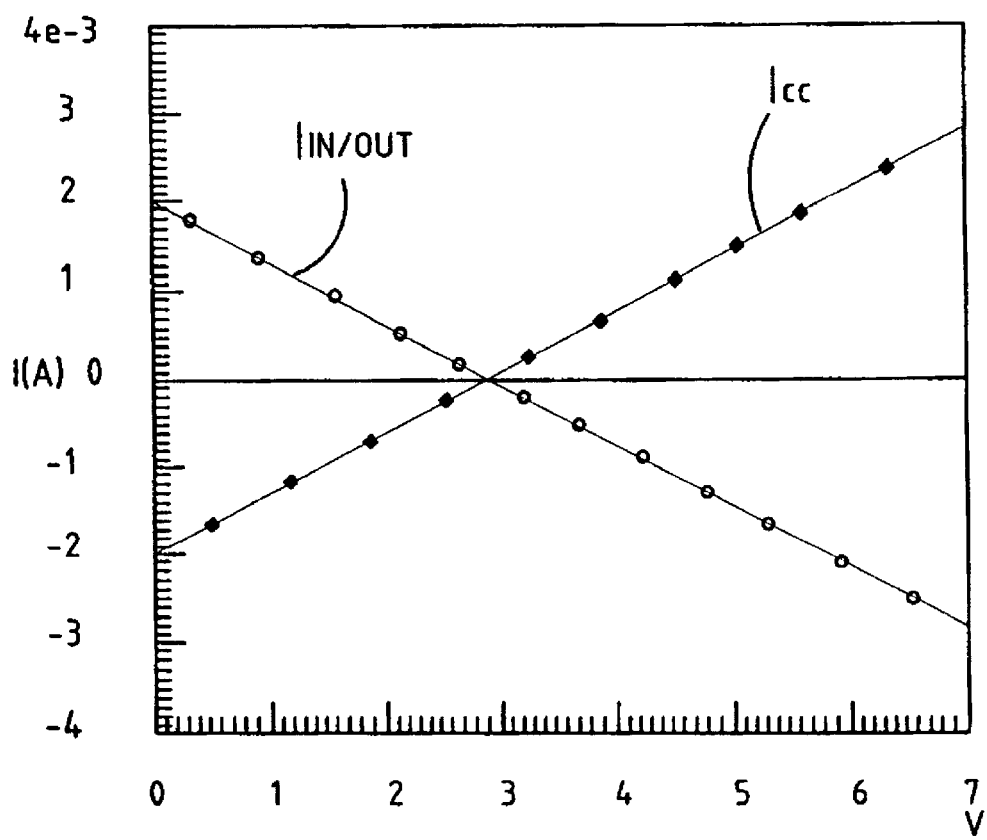
FIG. 5 is a diagram of the variation in currents on the terminal I/O and on the supply-voltage terminal depending on the voltage VI/O on the terminal I/O using a pull-up resistance as in FIG. 1.

The graphs in FIGS. 4 and 5 show variations in the currents Iin/out on the terminal I/O and Icc on the supply-voltage terminal depending on the voltage VI/O for the circuit in FIG. 3 (FIG. 4) and for a prior-art circuit consisting of a pull-up resistance as in FIG. 1 (FIG. 5). The value of the supply voltage is Vcc=3V and the voltage VI/O varies between 0 and 7V. We can see that the currents Iin/out and Icc for the circuit in FIG. 3 have values near zero except for a range of VI/O values around the VI/O=Vcc value, wherein the values of the currents Iin/out and Icc for the circuits in FIGS. 3 and 1 coincide.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A pull-up circuit for an input/output terminal of an electronic appliance, said circuit being arranged between the input/output terminal and a supply voltage terminal, the circuit comprising:
 a first transistor and a resistance that are serially connected and coupled between said input/output terminal and said supply voltage terminal; and
 circuitry suitable for driving said transistor so as to switch it on or off depending on whether values achieved by a voltage of the input/output terminal belong or do not belong to a set range of voltage values that includes a supply voltage of the supply voltage terminal, wherein said circuitry comprises:
 a first device for driving said first transistor, said first device comprising a plurality of MOS transistors having respective bulk terminals; and
 a second device coupled to the bulk terminals and structured to bias the bulk terminals of said MOS transistors and a bulk terminal of the first transistor at the higher of either a voltage value at or slightly below the voltage on the input/output terminal and a voltage value near the supply voltage.

2. A circuit according to claim 1, wherein said range of voltage values comprises voltage values no more than two volts above or below the supply voltage.

3. A circuit according to claim 1 wherein said first transistor is a MOS transistor.

4. A circuit according to claim 3, wherein said first transistor is a p-channel MOS transistor having a drain terminal connected to a terminal of said resistance and a source terminal connected to the supply voltage terminal.

5. A circuit according to claim 1, wherein said plurality of MOS transistors includes:
 a p-channel second transistor with a gate terminal coupled to said input/output terminal, a source terminal coupled to said supply voltage terminal, and a drain terminal coupled to a gate terminal of the first transistor;

a p-channel third transistor having a gate terminal connected to the supply voltage terminal, a bulk terminal, a source terminal connected to the bulk terminal, and a drain terminal connected to the gate terminal of the first transistor;

a p-channel fourth transistor having a gate terminal that is grounded, a source terminal connected to the supply voltage terminal, and a drain terminal connected to the input/output terminal; and an n-channel fifth transistor having a gate terminal connected to the supply voltage terminal, a source terminal that is grounded, and a drain terminal connected to the drain terminal of the third transistor.

6. A circuit according to claim 5, wherein said set range of voltage values includes voltage values comprised between a first voltage value defined by the difference between the supply voltage and a voltage value defined by a threshold voltage of the second transistor plus a voltage deriving from dimensions of the second transistor and the fifth transistor, and a second voltage value defined by the supply voltage added to a threshold voltage of the third transistor and of a voltage deriving from dimensions of the third and fifth transistors.

7. A circuit according to claim 6, wherein said second device comprises a first and a second MOS diode arranged in a back to back connection between them and coupled between the supply voltage terminal and the input/output terminal, and a p-channel MOS sixth transistor having a gate terminal connected to the supply voltage terminal, a drain terminal connected to the input/output terminal, and a source terminal connected to drain terminals of the two MOS diodes and to the bulk terminals of the first transistor and of the p-channel MOS transistors belonging to the first device.

8. A circuit according to claim 7, said two MOS diodes include two p-channel MOS transistors with shared drain and gate terminals.

9. A circuit according to claim 8, wherein said voltage value at or slightly below the voltage on the input/output terminal and said voltage value near the supply voltage are defined respectively by the difference between the voltage on the input/output terminal and a threshold voltage of the second MOS diode and the difference between the supply voltage and a threshold voltage of the first MOS diode.

10. A pull-up circuit for an input/output terminal of an electronic appliance, the circuit comprising:

a first transistor having a control terminal and a bulk terminal;

a resistance serially connected with the first transistor between the input/output terminal and a supply voltage terminal; and a driver having a first output coupled to the control terminal of the first transistor and a first input coupled to the input/output terminal, the driver being structured to control the first transistor based on an I/O voltage at the input/output terminal; and a bulk driver having a first input coupled to the supply voltage terminal, a second input coupled to the input/output terminal, and an output coupled to the bulk terminal of the first transistor, the bulk driver being structured to bias the bulk terminal of the first transistor at the higher of either a voltage value at or slightly below the I/O voltage and a voltage value near a supply voltage of the supply voltage terminal.

11. The circuit of claim 10 wherein the driver has a second input coupled to the supply voltage terminal and the driver is structured to switch off the first transistor in response to either the I/O voltage being less than a predetermined first threshold voltage that is related to and less than a supply voltage at the supply voltage terminal or the I/O voltage being greater than a second threshold voltage that is related to and greater than the supply voltage.

12. The circuit of claim 11 wherein the first and second threshold voltages are within two volts of the supply voltage.

13. The circuit of claim 10 wherein the bulk driver includes:

a first MOS diode having a source coupled to the supply voltage terminal, and a gate and drain coupled together and to the bulk terminal of the first transistor;

a second MOS diode having a source coupled to the input/output terminal, and a gate and drain coupled together and to the drain of the first MOS diode; and a PMOS second transistor having a gate connected to the supply voltage terminal, a drain connected to the input/output terminal, and a source connected to drain of the MOS diodes and to the bulk terminal of the first transistor.

14. A pull-up circuit for an input/output terminal of an electronic appliance, the circuit comprising:

a first transistor having a control terminal and a bulk terminal, wherein the first transistor is a PMOS transistor having a gate;

a resistance serially connected with the first transistor between the input/output terminal and a supply voltage terminal; and a driver having a first output coupled to the control terminal of the first transistor and a first input coupled to the input/output terminal, the driver being structured to control the first transistor based on an I/O voltage at the input/output terminal, wherein the driver further includes:

a PMOS second transistor with a gate coupled to the input/output terminal, a source coupled to the supply voltage terminal, and a drain coupled to the gate of the first transistor;

an NMOS third transistor having a gate connected to the supply voltage terminal, a source that is grounded, and a drain terminal connected to the gate of the first transistor.

15. The circuit of claim 14 wherein the driver further includes:

a PMOS fourth transistor having a gate connected to the supply voltage terminal, a bulk terminal, a source connected to the bulk terminal, and a drain connected to the gate of the first transistor; and a PMOS fifth transistor having a gate that is grounded, a source connected to the supply voltage terminal, and a drain connected to the input/output terminal.

16. A pull-up circuit for an input/output terminal of an electronic appliance, the circuit comprising:

a first transistor having a bulk terminal;

a resistance serially connected with the first transistor between the input/output terminal and a supply voltage terminal;

means for controlling the first transistor based on an I/O voltage at the input/output terminal; and means for biasing the bulk terminal of the first transistor based on the I/O voltage and on a supply voltage at the supply terminal.

17. The circuit of claim 18 wherein the means for biasing include a first transistor connected between the input/output terminal and the bulk terminal and having a control terminal connected to the supply voltage terminal.

18. A pull-up circuit for an input/output terminal of an electronic appliance, the circuit comprising:

a first transistor having a control terminal;

a resistance serially connected with the first transistor between the input/output terminal and a first supply voltage terminal;

a second transistor with a control terminal coupled to the input/output terminal, a first conduction terminal coupled to the first supply voltage terminal, and a second conduction terminal coupled to the control terminal of the first transistor; and a third transistor having a control terminal connected to the first supply voltage terminal, a first conduction terminal connected to a second supply voltage terminal, and a second conduction terminal connected to the control terminal of the first transistor.

19. The circuit of claim 18, further comprising:

a fourth transistor having a control terminal connected to the first supply voltage terminal, a bulk terminal, a first conduction terminal connected to the bulk terminal, and a second conduction terminal connected to the control terminal of the first transistor; and a fifth transistor having a control terminal connected to the second supply voltage terminal, a first conduction terminal connected to the first supply voltage terminal, and a second conduction terminal connected to the input/output terminal.

20. The circuit of claim 19, further comprising:

a sixth transistor having a control terminal connected to the first supply voltage terminal, a first conduction terminal connected to the input/output terminal, and a second conduction terminal connected to the bulk terminal of the fourth transistor and bulk terminals of the first, second, and fifth transistors.

21. The circuit of claim 18, further comprising:

a fourth transistor having a control terminal connected to the first supply voltage terminal, a first conduction terminal connected to the input/output terminal, and a second conduction terminal connected to a bulk terminal of the first transistor.

22. The circuit of claim 21 wherein the second transistor has a bulk terminal connected to the bulk terminal of the first transistor and to the second conduction terminal of the fourth transistor.

* * * * *

UNITED STATES PATENT AND TRADEMARK OFFICE
CERTIFICATE OF CORRECTION

PATENT NO. : 6,703,873 B2 Page 1 of 1
DATED : March 9, 2004
INVENTOR(S) : Marco Martini et al.

It is certified that error appears in the above-identified patent and that said Letters Patent is hereby corrected as shown below:

<u>Column 6,</u>
Line 66, "The circuit of claim 18" should read as -- The circuit of claim 16 --.

Signed and Sealed this

Tenth Day of August, 2004

JON W. DUDAS
*Acting Director of the United States Patent and Trademark Office*